United States Patent [19]

Powell

[11] Patent Number: 4,542,336

[45] Date of Patent: Sep. 17, 1985

[54] METHOD AND APPARATUS FOR SAMPLING BROAD BAND SPECTRA IN FUEL QUANTITY MEASUREMENT SYSTEMS

[75] Inventor: Fred D. Powell, Middlebury, Vt.

[73] Assignee: Simmonds Precision Products, Inc., White Plains, N.Y.

[21] Appl. No.: 493,532

[22] Filed: May 11, 1983

[51] Int. Cl.⁴ .............................................. G01R 23/16
[52] U.S. Cl. .................................... 324/77 B; 364/485
[58] Field of Search ................. 324/77 R, 77 B, 77 D, 324/77 E, 77 G; 73/304 C; 364/484, 485

[56] References Cited

U.S. PATENT DOCUMENTS

| | | | |
|---|---|---|---|
| 3,881,097 | 4/1975 | Lehmann | 324/77 D |
| 3,916,689 | 11/1975 | Donnelly | 73/304 C |
| 4,054,785 | 10/1977 | Lehmann | 324/77 D |
| 4,067,060 | 1/1978 | Poussart | 324/77 B |
| 4,093,989 | 6/1978 | Flink | 324/77 B |
| 4,169,245 | 9/1979 | Crom | 324/77 G |
| 4,321,680 | 3/1982 | Bertrand | 324/77 B |

Primary Examiner—Michael J. Tokar
Attorney, Agent, or Firm—Edwin E. Greigg

[57] ABSTRACT

A method and apparatus is proposed for sampling at a low rate a broad band sparse spectrum without aliasing to a specified band in which a lowest sampling frequency is found by selecting that signal level from the spectrum which is considered negligible and finding the bandwidths at which the information bands about the carrier frequency multiple reaches this level, then arranging forbidden or unaccepted values of the remainder r of the quotient of the carrier frequency divided by the sampling frequency into a series in order of magnitude, further selecting those sampling frequencies at which adjacent forbidden ranges of the remainder become contiguous, selecting the least value thereof in order to ascertain the corresponding permissible value of the remainder r, and finally determining the corresponding least sampling frequency and the maximum integer value multiple of a clock count, thus establishing the maximum sampling interval.

14 Claims, 7 Drawing Figures

METHOD AND APPARATUS FOR SAMPLING BROAD BAND SPECTRA IN FUEL QUANTITY MEASUREMENT SYSTEMS

BACKGROUND OF THE INVENTION

Broad band sparse spectra are very common; such spectra are generated whenever a modulated sinusoidal carrier passes through a dead zone, a limiter, a rectifier, or any other single valued nonlinearity, whether desired or not, or even in the case where the carrier is not a perfect sinusoid. Some of these nonlinearities can occur to some extent in anti-aliasing or low-pass filters (LPF), and use of this method of sampling can therefore offer many disadvantages to digital systems. For example, anti-aliasing filters consume power, require space, evolve undesirable heat, contribute error to the digital system which follows the sampler and quantitizer, are costly, and are a potential source of failures.

Known digital sampling techniques require that each channel which is to be sampled be preconditioned as, for example, with low-pass filters. In the context of capacitive fuel quantity, this preconditioning may require one LPF for each probe, or each group of probes connected in parallel, with the result that the aforementioned undesirable factors—cost, weight, power, heat, space, phase and gain changes and other errors—are introduced into the digital system. It is therefore advantageous not only to omit the use of anti-aliasing pre-filters in digital sampling techniques, but to sample as well at the lowest possible frequencies, or equivalently to determine at the same time the largest sampling interval which has the desired non-aliasing property.

OBJECT AND SUMMARY OF THE INVENTION

In order to overcome the disadvantages inherent in preconditioned, low-pass filter digital sampling techniques, the present invention provides a method employing the circuitry described hereinafter for analysing a broad band sparse spectrum which can be physically generated in a variety of ways, such as when a carrier is amplitude modulated by a narrow band signal and then rectified to enable detection, as in the case of the output of a sensing device that has single-valued nonlinearity, for example, a capacitive sensor in series with a rectifying diode in fuel quantity measurement systems, or in the case when the carrier's wave form itself departs from perfect sinuosity. These processes cause the various bands of modulation to appear with various amplitudes about every multiple of the carrier frequency. This produces a broad-band spectrum. But if the excitation frequency is relatively low, such as less than 30 to 50 kilohertz, then electromagnetic interference and other such phenomena are sensibly absent for the lower multiples. The spectrum is thus sparse: There is no significant energy in the spectrum except in the narrow bands about the carrier frequency multiples. This spectrum may also be described as "generalized band-limited," generalized because there are many bands in which there is energy, "band-limited" because there is no energy except in these bands. This concept, which is basic to the invention described hereinafter, is a significant departure from the known concept that such a band-limited spectrum has energy in only one band.

It is therefore possible with this class of spectra to eliminate preconditioning by low-pass filtering and instead sample at a low rate without aliasing to a specified band about the origin. The sampling frequency is selected such that all its integer multiples lie in regions of the spectrum where there is no nearby energy to be aliased, or, conversely, so that no multiple lies in or near a region of the spectrum where there is energy. Acceptable bands of sampling frequencies exist in sets of pairs for each of a number of greatest lower bounds (GLB) which are identified for each set of bands of sampling frequency. The lowest possible acceptable frequency is then determined along with a maximum sampling interval which has the desired non-aliasing property.

The method according to the invention offers a variety of uses in signal processing which would prove both efficient and cost effective by eliminating heretofore complex steps. For example, the invention could be employed on-line, as in a vehicle, to determine the sampling interval for another subordinate device to use, such as fuel quantity gauging systems which ordinarily require high aliasing filters and a high sampling rate. Or a method embodied by the analog/digital circuitry according to the invention could be used off-line in a laboratory to determine an appropriate sampling interval which an on-line digital device could then subsequently use.

According to a preferred method of the invention, the lowest sampling frequency is found by selecting that signal level from a broad band sparse spectrum which is considered negligible and finding the bandwidths at which the information bands about the carrier frequency multiples reaches this level, then arranging forbidden or unaccepted values of the remainder r of the quotient of the carrier frequency divided by the sampling frequency into a series in order of magnitude, further selecting those sampling frequencies at which adjacent forbidden ranges of the remainder become contiguous, selecting the least value thereof in order to ascertain the corresponding permissible value of the remaider r, and finally determining the corresponding least sampling frequency and the maximum integer value multiple of a block count, thus establishing the maximum sampling interval.

Other features, advantages and objects of the invention will be more fully understood and more fully explained if a reading of the following detailed description is undertaken in conjunction with the appended drawings in which:

DETAILED DESCRIPTION OF THE PREFERRED EMBODIMENT

Figure 1A:
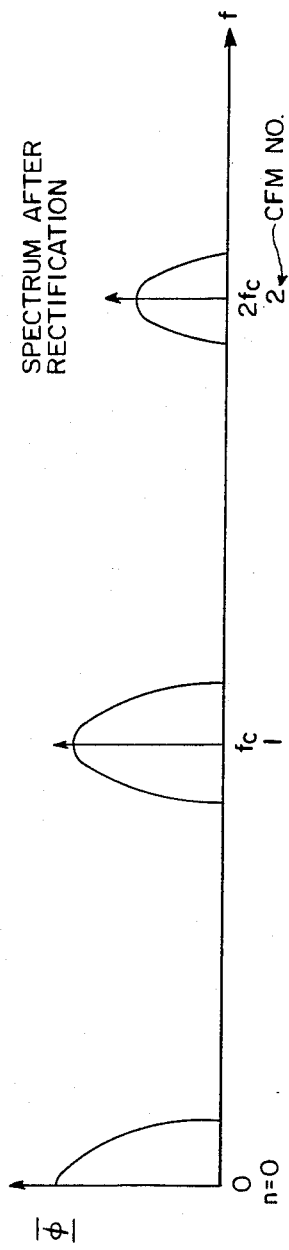
FIGS. 1a and 1b are waveform diagrams of a rectified signal spectrum subjected to sampling according to the invention.
Figure 1B:
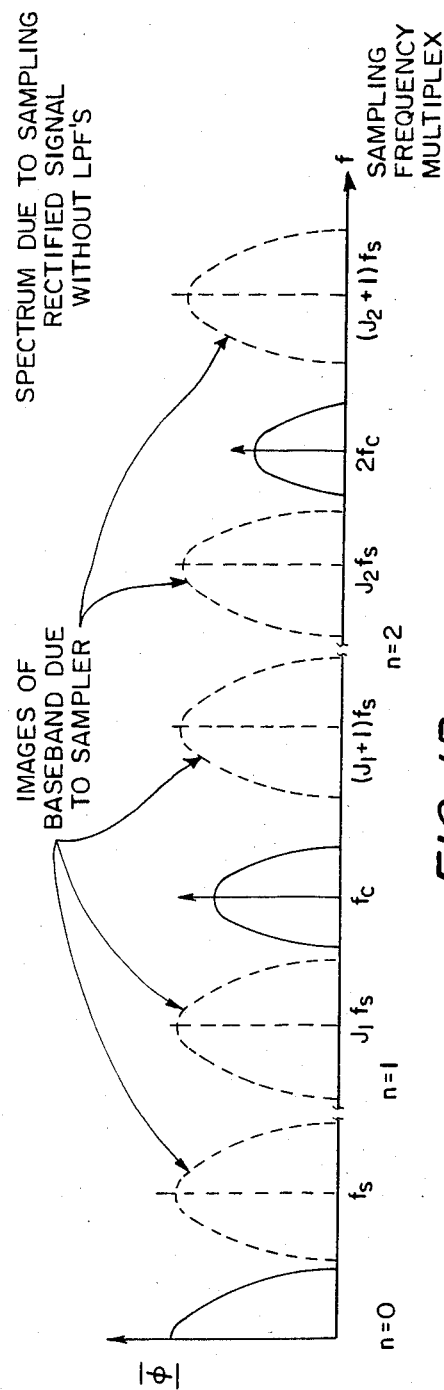

FIGS. 1a and 1b show the sampling frequency selection technique according to the invention for achieving non-aliasing without using a low pass signal-conditioning filter. FIG. 1a shows the broad-band sparse spectrum $\Phi$ after rectification, in which there is energy in the baseband and about every carrier frequency ($f_c$)

multiple up to the Nth multiple. When this signal is sampled at the frequency $f_s \geq 2f_o$, images of the baseband appear centered at every sampling frequency multiple, as shown in FIG. 1b. To avoid excessive complexity, FIG. 1b does not show the images (which will appear due to sampling) of the bands about $f_c$, $2f_c$, etc. These bands are in general located at $f = nf_c$, and the images are centered at $f = nf_c \pm jf_s$, where j is the sampling frequency multiple. There will be no aliasing to the baseband if, and only if, no skirt of any image of the baseband overlaps the skirt around any carrier frequency multiple. If this condition is satisfied, then no image of the bands created by sampling, which lie at $(nf_c \pm jf_s)$, will have a skirt overlapping the baseband. It is necessary therefore to choose a sampling frequency, $f_s$, such that no skirt of the baseband images overlaps the skirt about any carrier frequency multiple.

Assuming then that a carrier is amplitude modulated by a narrow band signal centered at DC, and then passes through some nonlinear operation which may be described by periodic functions, such as half or full-wave rectification, clipping, dead-band, etc., there results a spectrum $\Phi$ of the general form (where I is the CFM, $B_I$ is the bandwidth relative to $If_c$ of band at the Jth CFM, and $B_o$ is the bandwidth relative to origin to be protected against aliasing):

$$\Phi(f) \neq 0, \ If_c - B_I \leq f \leq If_c + B_I, \ I = 0,1,2,\ldots,n \quad (1)$$
$$= 0, \text{ otherwise}$$

with $B_o \neq 0$ and at least some $B_I \neq 0$.

Signals below a certain level (e.g. $-80$ db) are neglected, hence N is finite and the bandwidths $B_I$ are not constant but may vary with I. This spectrum then is sampled at a low rate, to be determined. Given a broad sparse band spectrum, without using an anti-aliasing filter, it is necessary to find sampling frequencies which will not cause aliasing to a given band $\pm f_o$ such that for all values of I, $I = 0, 1, 2, \ldots, n$, there is no integer value of $J \neq 0$ such that $$If_c - (B_o + B_I) \leq Jf_s \leq If_c + (B_o + B_I) \quad (2).$$

Figure 2:
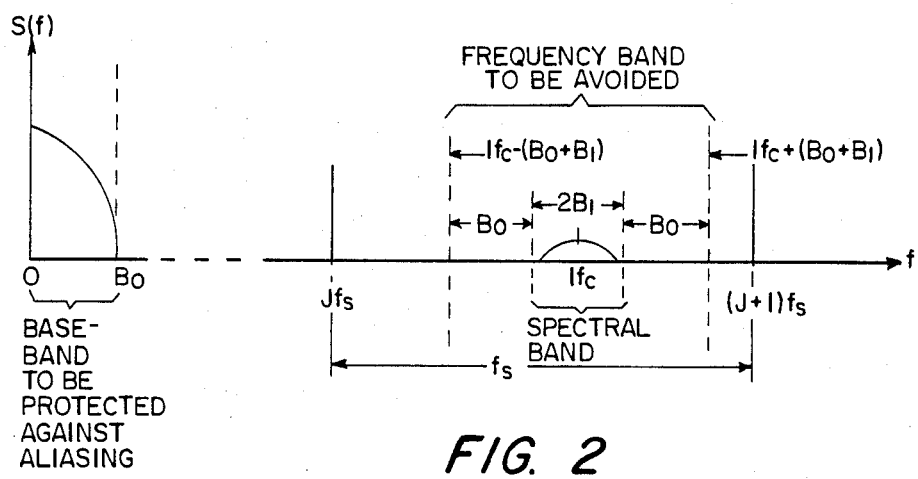
FIG. 2 is a waveform diagram indicating the desired relation between sampling frequency and spectral band.

This is a rejection criterion; any $f_s$ which satisfies (2) must be rejected because its Jth multiple lies too near a region of the spectrum where there is signal so that there will be aliasing to the region about the origin which is to be protected, such as shown in FIG. 2.

An analysis is accomplished by using the frequency ratio $$R + r = f_c / f_s \quad (3)$$

where R is the integer part of the quotient of the carrier frequency, $f_c$, divided by the sampling frequency, $f_s$, and r is the remaider. On substitution of (3) into (2) to eliminate $_c$, the rejection criterion becomes $$(I_R + I_r) - (B_o + B_I)/f_s \leq J \leq (I_R + I_r) + (B_o + B_I)/f_s \quad (4).$$

Figure 3:
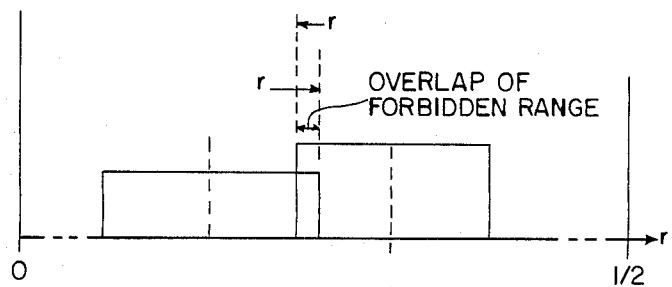
FIG. 3 is a waveform diagram illustrating an overlap of forbidden ranges.

The method for finding acceptable values of $f_s$ depends primarily on the remainder r. Certain values and ranges of r are forbidden, and the condition under which a value of r is acceptable is a function of the sampling frequency. Forbidden or unacceptable values of r are then determined, and a forbidden range of r about each forbidden value thereof is established; is inversely proportional to $f_s$ while, it has been found, the forbidden value at the center of the range is independent thereof. Therefore, as $f_s$ increases, any two forbidden ranges, which must overlap at low values of $f_s$, as shown in FIG. 3, do not move but become narrower until the upper end of one range becomes identical with the lower end of a higher range; i.e., the forbidden ranges become contaguous.

At larger values of $f_s$ a gap must appear between that pair of forbidden ranges of r; this gap then is an acceptable band of r and thus implies an acceptable band of $f_s$.

Adjacent forbidden ranges overlap and fill the space of r at values of $f_s$ for which ranges distant from each other have gaps. It is necessary, then, to determine the sampling frequency which results in contiguity of adjacent forbidden ranges of r. This condition of contiguity shows that acceptable sampling frequencies exist in bands, and that the largest and smallest acceptable values of each band of sampling frequency can be determined, and further that a greatest lower bound (GLB) of sets of ranges for acceptable sampling frequencies can be established for sampling frequency and for finding acceptable values for R and r. Toward this end, all forbidden values of r are arranged in an ascending order of magnitude in least terms, for example, in a Farey sequence of order N,[1],[2]. For each adjacent pair of forbidden values a GLB of sampling frequency is found for that pair $$f_s^* = (I+K)B_o + IB_k + KB_I \quad (5).$$

Each of these values, $f_s^*$, is the GLB of a set of bands of acceptable sampling frequencies. Each solution $f_s^*$, (5), leads then to two disjoint finite subsets of disjoint bands of acceptable values of $f_s$. The least value of $f_s$ is the GLB which yields the lowest frequency band; it will yield the maximum value of R for its particular set of bands. In determining the bounds of the set of acceptable bands of sampling frequencies, only the lower and upper bound of solutions for an acceptable sampling frequency band, designated as $f_{S-}$ and $f_{s+}$ respectively, need be found.

Every sampling frequency in the range, $f_{s-} \leq f_s \leq f_{s+}$, has the desired non-aliasing property.

It is normal in digital systems to specify the sampling interval rather than frequency, since the sampling interval and carrier frequency are set by integer numbers of counts in registers driven by a clock. It is therefore necessary to supply the largest acceptable sampling interval which has this integer property. Because $f_c/f_s = N_s/N_c$ (where $N_s$ is the number of clock counts per cycle of sampling, and $N_c$ is the number of clock counts per cycle of carrier), values for the real numbers, $N_{s-}$ and $N_{s+}$, correspond respectively to the lowest and highest sampling frequencies for the bands defined by integer values of $q = 0, 1, 2 \ldots R'$. $N_c$ is selected as an integer and q is incremented until the integer value of $N_{s-}$ is not equal to the integer value of $N_{s+}$, when the former is the desired interval. Also, $f_c$ can be expressed in terms of $N_c$ when the clock rate is specified.

Figure 4:
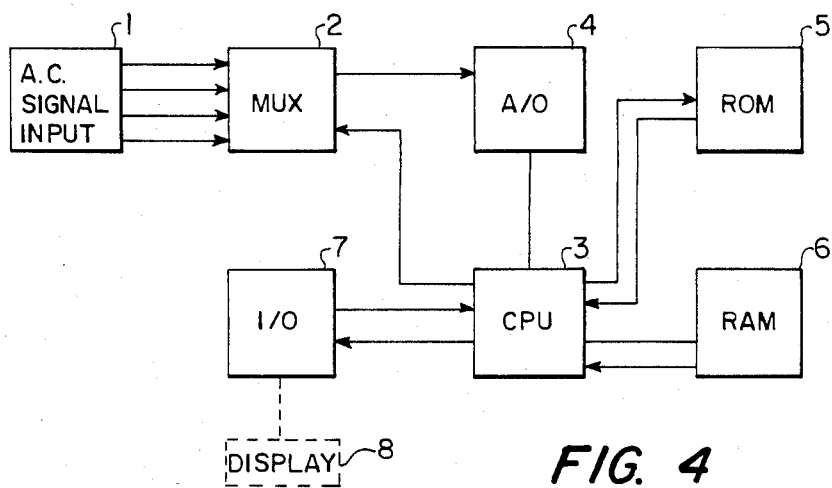
FIG. 4 is a block circuit diagram illustrating a computer system for carrying out the invention.

FIG. 4 shows a computer realization of the invention above described in which there is provided a means 1 for sensing fuel quantity, such as a capacitance fuel tank gauge, not shown, but more completely described and shown in U.S. Pat. No. 3,916,689. Such a capacitive sensor is usually formed by a concentric pair of metal tubes. The fuel between these tubes has a dielectric constant which differs from that of air; therefore the capacitance of the sensor depends upon the depth of fuel. Such a capacitor is normally excited by a constant oscillatory carrier signal, and the capacitor modulates the carrier in accordance with the depth of fuel. The usual procedure for detecting capacitance involves half or full-wave rectification of the output of the capacitor, and in some cases this rectification is accomplished at the sensor, while in others it is accomplished elsewhere in the system; there are known as DC and AC signalling in the fuel quantity sensing art, and the subject invention is applicable to either approach for each uses rectification at some point in order to detect the fuel depth of the capacitive sensor.

Thus the rectified AC signal, or family of signals, is fed to a multiplexer 2. The entering rectified signals are selected in turn at the frequency or sampling interval determined by the central computer processing unit 3, according to the method of the invention. An A/D converter 4 then converts the signal into digital form. The CPU 3, central processing unit, performs the functions above described, while a ROM 5 (read only memory) stores the programs and the coefficients to be described below; further, a RAM 6 (random access memory) stores the numerical values developed at various stages of the procedure, again to be described below. An input/output section 7 provides for input and output communication with the operator or with other devices, such as a digital display 8, as shown, or other displays, analog, logging device, or CRT, not shown.

The central processing unit 3 analyzes the incoming signals to determine their spectrum as to the number of bands containing significant levels of energy, and also the bandwidth of each such band. The lowest sampling frequency is then determined, or at least the equivalent sampling interval which will enable sampling without aliasing to the base band which contains the useful information. The CPU also schedules the action to be taken by the multiplexer 2 and thus the A/D converter 4 at the rate determined and then finally contains the digital filter appropriate to minimize noise in the output 7. Fuel quantity is thus estimated as a function of measured depth by the capacitive sensor or equivalent sensing device.

Figure 5A:
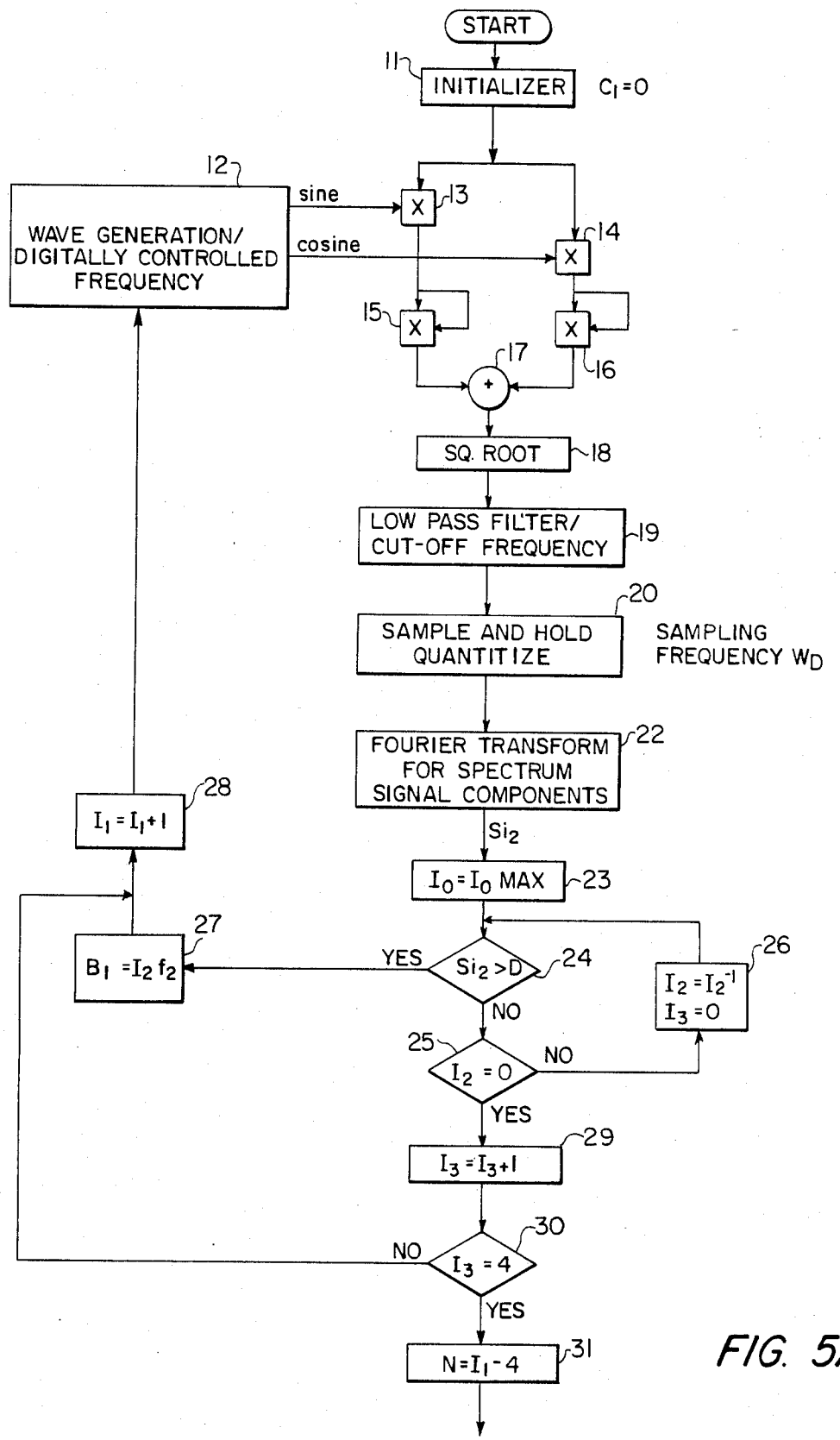
FIGS. 5a and 5b is a flow chart illustrating the program stored in the memory systems shown in FIG. 3.
Figure 5B:
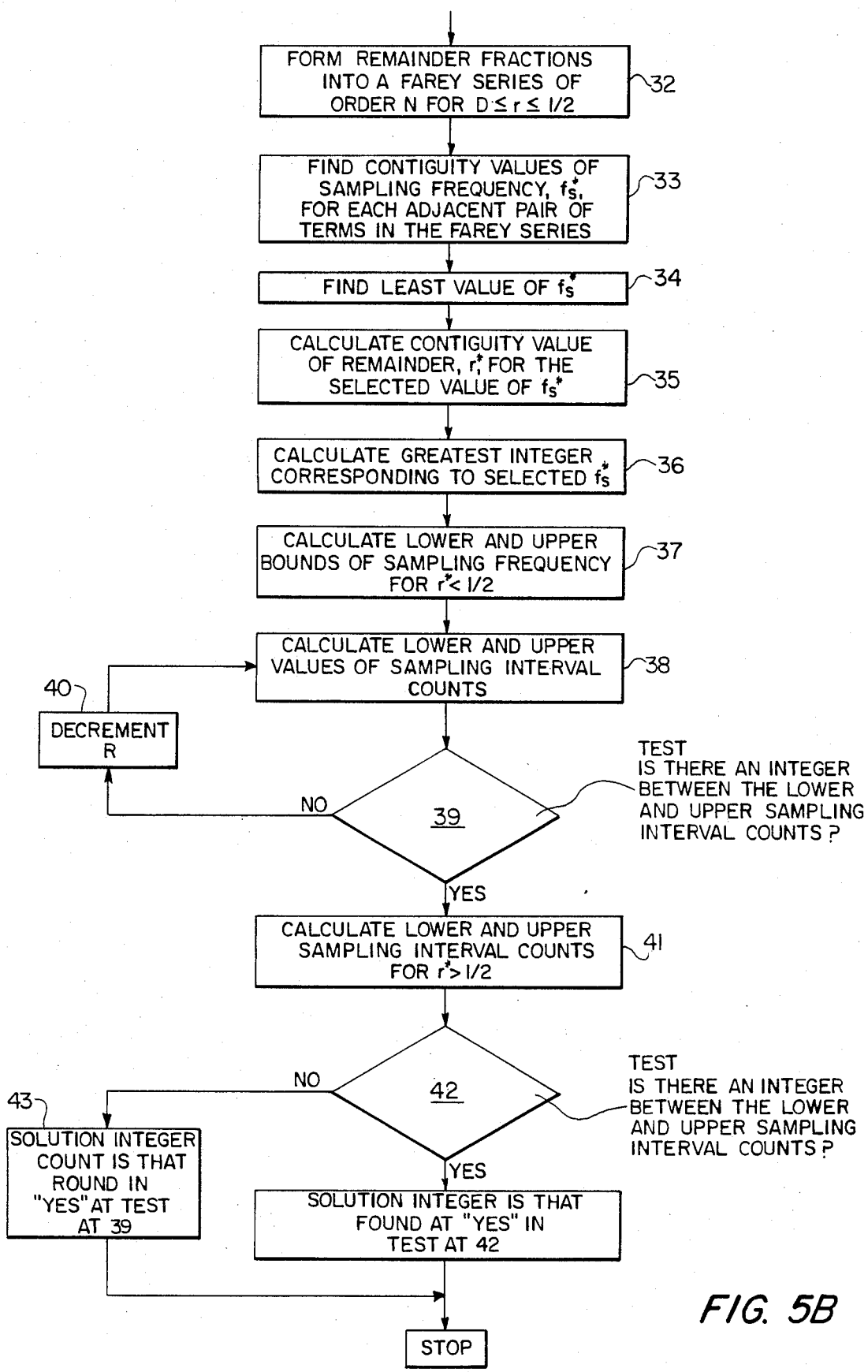

With reference now to FIGS. 5a and 5b, which show a detailed flow chart for carrying out the invention, the program for controlling the input/output control section 7 in a closed loop manner will now be described. The blocks in the program indicate functional steps of the program and correspond to the functional hardware or computer implementation of the program illustrated as the digital system in FIG. 4 for determining the minimum sampling frequency and the maximum sampling interval.

Referring now to FIG. 5a, which presents the analog portion of the hybrid embodiment of the invention, there is shown a signal that has the characteristics required to be broad band sparse as described above. It should be noted that, as observed above, if the signal is the output of a sensor, then it is broad band sparse if the sensor has any single valued nonlinearity, whether inadvertent or planned as in the case of a capacitive sensor is series with a rectifying diode such as used in fuel quantity gauging systems.

The input signal has a number of bands of energy located about $If_c$. These bands will be shifted, one at a time, to DC by multiplying the input by a sine and a consine wave of frequency $I_1 f_c$, where the multiplying index coefficient must take on the values $I_1 = 0, 1, 2, \ldots, n$. It is necessary to initialize this index at the stage 11. When the signal is multiplied by sin $(I_1 f_c t)$ and by cos $(I_1 f_c t)$ the spectral band at $I_1 f_c$ is transferred to the origin while other frequencies are shifted but not to the origin. It is then possible to isolate the band at the origin and eliminate the other bands with a filter. A suitable sine and cosine wave generator 12 is used for this purpose. Its frequency, $I_1 f_c$ is digitally controlled from block 28, and its output is analog. Such wave form generators are well known and need not be described further. The input signal is multiplied by sin $(I_1 f_c t)$ in the multiplier 13 and by cos $(I_1 f_c t)$ in multiplier 14; the products are squared in multipliers 15 and 16 respectively and are summed in a summing amplifier 17. The square root is then taken at 18 by a suitable square root device.

The input signal having now been modified so that one of its frequency bands, centered at $I_1 f_c$, has been transferred to the vicinity of DC, while the other frequency bands are distant by various multiples of $f_c$, it is now necessary to determine the number of bands in which the signal is non-negligible and also the bandwidth of each such band.

For this purpose it is necessary to determine the frequency spectrum of each band. This operation can be accomplished in either an analog or a digital manner, and in the present case a digital analyzer is preferred. This digital step requires a sampler 20 which is preceded by an anti-aliassing filter 19. The cutoff frequency of the anti-aliassing filter $f_B$ should be in the range $2B_o < f_b < f_c/2$, where $B_o$ is an estimate of the modulation bandwidth. Such anti-aliassing filters are within the state of the art and are available commercially. Once the digital sampling and quantizing step is accomplished with a sampling rate that exceeds $2f_B$, the program is ready for a solely digital format.

The sequence of discrete data, from the sampler and quantitizing stage 20, must now be analyzed to find the bandwidth of the narrow band in question. A Discrete Fourier Transform (DFT) Program 22 issued to find the details of its spectrum about the origin, to which the spectrum band has been shifted. A variety of such discrete Fourier transforms are readily available; see, for instance, "Programs for Digital Signal Processing", IEEE Press, New York, 1979, for several such programs.

The procedure for finding the bandwidth about $I_1 f_c$ will now be outlined. A register 23 is set at the highest multiple $I_2$ max of the fundamental frequency of the DFT, $f_2$. At 24 it is determined whether the magnitude of that frequency component exceeds the decision level D, which might for example be at the 3-80 db level. If there is no significant signal at that frequency, then the bandwidth is less than $I_2 f_2$ at 26, and $I_2$ max is decremented to $I_{2max} - 1$. This process of decrementing continues until a signal at 24 exceeds the decision-level D. Then the bandwidth for that band has been determined as $B_I = I_2 f_2$ at 27. The digital counter at 28 may now be incremented and the next frequency band in the spectrum will be examined. However, the process of decrementing in 26 may continue without finding any signal about the decision level down to DC. This case, detected at 25, shows that there is no signal above the decision level anywhere in that band. The logic selection in 29, 30 and 31 stops the analysis procedure after finding no significant signal in the bands around four adjacent carrier frequency multiples, and therefore sets the number of carrier frequency multiples at N.

When the number N representing the highest carrier frequency multiple with significant signal has been found, it is necessary to develop a Farey sequence of order N of the forbidden values of the remainder r at 32, shown in FIG. 5b. Algorithms for formation of Farey sequences are known, and can be found in "An Introduction to the Theory of Numbers", G. H. Hardy and E. M. Wright, Fourth Ed., Clarendon Press, Oxford 1960.

Where I and K are the denominators of adjacent fractions in the sequence developed at 32 and $B_I$ and $B_K$ are the spectral bandwidths of the signal spectrum about $I_{fc}$ and $K_{fc}$ determined at 27 then for the set of quantities:

$$f_s^* = (I+K)B_o + IB_k + KB_I \text{ (from equation 5 above)}$$

is found, as shown at 33 such as to make contiguous each pair of adjacent forbidden ranges of the remainder r.

The quantities $f_s^*$ are lower bounds for an acceptable sampling frequency. This invention, while it can be configured to find any or all valid sampling frequencies, is, in this particular embodiment, arranged to find the lowest value of the sampling frequency and the longest sampling interval, because these require the least use of the total computation facility and thus require the least cost. The least value of $f_s^*$, then, is selected by a suitable minimum value selection circuit at 34.

The principal purpose of the program at 35 is to calculate the contiguity value of the remainder of the frequency ratio for the least value of $f_s^*$ selected at 34. This contiguity value is $r^*$ defined as $$r^* = \frac{n}{I} + \frac{B_o - BI}{If_s^*}$$

where $r^* < \frac{1}{2}$ and n is the numerator of the lesser of the Farey sequence fractions which correspond to the least value of $f_s^*$ selected at 34.

The program at 36 calculates the value of the integer R, for the selected frequency $f_s^*$ according to $$R = INT\left(\frac{fc}{f_s^*} - r^*\right)$$

wherein INT is the greatest integer which does not exceed the argument $(fc/f_s^* - r^*)$.

At 37, the higher and lower sampling frequency boundaries are calculated as $$f_{s+} = \frac{fc - (Bo + BI)/I}{(R + n/I)}$$

and $$f_{s-} = \frac{fc + (Bo + BK)/K}{(R + m/K)}$$

respectively.

In a digital computer installation it is necessary to determine the sampling interval, and specifically the longest sampling interval, which will have the desired non-aliasing property. Define as Nc the integer number of computer clock counts per unit of time. Then the number of counts in the sampling interval is $N_s = Nc/f_s$ subject to the condition that N, must be an integer over the given unit of time. The process of finding the largest integer value of $N_s$ is described now, consistent with elements 38–45 in FIG. 5b. The lower and upper sampling interval count numbers are calculated respectively according to $N_{s+} = N_c/f_{s+}$ and $N_{s-} = Nc/f_{s-}$ at 38, while at 39 a test is performed to determine if the integer values of $N_{s+}$ and $N_{s-}$ are equal; if they are unequal, there is an integer value of $N_s$ between them.

In this case there is an integer between the values of $N_{s+}$ and $N_{s-}$; this presumably the desired solution for the required integer number of counts. If there is no integer, then R is decremented by unity at 40 and the calculation of the lower and upper sampling intervals at 38 is repeated. This process continues until the test at 39 shows that an integer number of counts has been found. Because the Farey sequence is symetrical about $\frac{1}{2}$ it is necessary, having determined the longest integer sampling interval count if $r^* = \frac{1}{2}$, to determine if there is a greater integer for $r^* > \frac{1}{2}$. In this case the procedure calculates the upper and lower sampling frequencies as $$f_{s+} = \frac{fc - (Bo + BK)/K}{R + (1 - m/K)}$$

and $$f_{s-} = \frac{fc + (Bo + BI)/I}{R + (1 - n/I)}$$

respectively, at 41.

At 41, the corresponding lower and upper sampling intervals are determined as before, and at 42, a test is made to determine if the integer lies between these two counts; if there if no such integer then the integer previously determined at 39 represents the solution at 43. If the test at 42 shows that an integer exists within the test range, then that is the desired number of clock counts; if not, then the integer found in the test at 39 is the desired number.

This procedure, which finds the longest non-aliasing sampling interval integer count, can find other such counts if desired, by repeated decrementing of R at 40, and/or by selecting other than the minimum value of $f_s^*$ at 34; for reasons outside the scope of this invention such lesser sampling intervals may be desirable.

Following is an example carried out by the method according to the invention which assumes a sinusoidal carrier with a frequency of $f_c = 6000$ Hertz. The modulation is assumed to be a narrow band about the origin. Rectification and the filtering effects of the sample-hold unit attenuate the signal below $-80$ db (defined as negligible) at band-widths shown in Table 1 for the various carrier frequency multiples I.

TABLE 1

| CARRIER FREQUENCY MULTIPLES, I: | | | |
|---|---|---|---|
| 0 | 1 | 2 | 3 |
| SPECTRUM SIGNAL BANDWIDTHS, $\pm B_I$: | | | |
| 4.60 | 4.30 | 2.90 | 1.25 |

When $I > 3$, the spectrum is below $-80$ db and therefore $N = 3$. We can then find the lowest sampling frequency which will not produce aliasing to the band $\pm B_o$ around the origin. The procedure and results are gathered in Table 2, below, whose first line presents the forbidden values of r as a Farey sequence of order 3 from 0 to 3. The second line presents the frequencies $f_s^*$ at which the boundaries of the various adjacent forbidden ranges become contiguous, from (8); thus for the (0/1, ⅓) pair, $f_s^* = (1+3)4.60 + 3(4.30) + 1(1.25) = 32.55$. The minimum value of $f_s^*$ is 32.55; this is the least GLB of sampling frequency. These two lines of Table 2 show that the lowest frequency solution for $r^*$ lies in the gap between the forbidden regions for $r=0/1$ and $r=\frac{1}{3}$ (or between $r=\frac{2}{3}$ and $r=1$). With $f_s^*=32.55$ one finds $r^*=0.2734254792$. The lowest and highest sampling frequencies in this lowest acceptable band are $f_{s-}=32.560307$ and $f_{s+}=32.560326$. Any value of $f_s$ within this range will be acceptable, and may now be used in (2), if desired, to show the clearance of the solution's multiples from each of the signal bands. The value $f_s=32.560315$ is an acceptable value. The third line in Table 2 presents the forbidden ranges of r and shows the resulting gap between the upper end of the (0/1) range, where $r=0.27339$, and the lower end of the ($\frac{1}{3}$) range, where $r=0.27344$.

TABLE 2

| FORBIDDEN VALUES OF r | 0/1 | ⅓ | ⅔ |
|---|---|---|---|
| CONTIGUITY FREQUENCIES $f_s^*$ | | 32.55 | 34.20 |
| FORBIDDEN RANGES OF r WITH $f_s$ | 0–0.27339 | 0.27344–0.393 | 0.384–0.615 |

The foregoing relates to a preferred embodiment of the invention, it being understood that other embodiments and variants thereof are possible within the spirit and scope of the invention, the latter being defined by the appended claims.

What is claimed and desired to be secured by Letters Patent of the United States is:

1. A method for sampling a broad band sparse spectrum Φ having a base band and a carrier frequency $f_c$ comprising the steps of,
    (i) determining the number of bands in said spectrum containing significant levels of energy,
    (ii) determining the bandwidths of each of said bands, and
    (iii) selecting a sampling frequency of said bands such that all the integer multiples thereof lie in a region of said spectrum where there is no energy to be aliased.

2. A method for determining sampling frequencies of a broad band sparse spectrum Φ having a base band, a carrier frequency $f_c$ and a sampling frequency $f_s$, comprising the steps of,
    (i) determining the number of bands in said spectrum containing significant levels of energy,
    (ii) determining the bandwidths of each of said bands, and
    (iii) arranging for said number of bands unacceptable values of the remainder of the quotient of $f_c/f_s$ into a series in order of magnitude,
    (iv) selecting those sampling frequencies which cause adjacent forbidden ranges of said remainder to become contiguous in said spectrum,
    (v) selecting a given value of said sampling frequencies, and
    (vi) obtaining a related sampling interval for said given value for said spectrum without aliasing to said base band.

3. A method according to claim 2, wherein said unacceptable values of the remainder of the quotient of $f_c/f_s$ are arranged into an ascending order of magnitude of least terms.

4. A method according to claim 3, wherein said sampling frequencies ($f_s^*$) in step (iv) exist as adjacent bands and determining for each adjacent pair of forbidden values a greatest lower band of a set of bands of acceptable sampling frequencies.

5. A method according to claim 4, wherein said sampling frequency ($f_s^*$) satisfies the equation $$f_s^* = (I+K)B_o + IB_K + KB_I,$$

where
    I and K are the denominators of adjacent quotients $f_c/f_s$ in said series of step (iii), and
    $B_I$ and $B_K$ are the spectral bandwidths of said signal about $If_c$ and $Kf_c$, respectively.

6. A method according to claim 2, wherein said given value is a least value of said sampling frequencies.

7. A method according to claim 6, wherein said related sampling interval is a maximum sampling interval for said spectrum.

8. A method according to claim 1, wherein said broad band sparse spectrum is generated by a rectified AC signal output from a liquid level sensing device.

9. A method according to claim 2, wherein said broad band sparse spectrum is generated by a rectified AC signal output from a liquid level sensing device.

10. An apparatus for sampling a broad band sparse signal spectrum having a base band and a carrier frequency, comprising,
    a liquid level sensing means for generating said signal spectrum,
    selection means for determining the number of bands in said spectrum containing significant levels of energy,
    means for measuring the bandwidths of each of said bands, and
    means for sampling the frequency of said bands, whereby all the integer multiples of said frequency lie in a region of said spectrum where there is no energy to be aliased.

11. An apparatus according to claim 10, wherein said selection means includes means for arranging unacceptable values of a carrier related sampling frequency for said number of bands.

12. An apparatus according to claim 10, wherein said means for sampling the frequency of said bands includes means for selecting sampling frequencies which cause adjacent forbidden ranges of said carrier related sampling frequency to become contiguous in said spectrum.

13. An apparatus according to claim 12, wherein said means for sampling the frequency of said bands includes means for selecting a given value of said sampling frequencies for obtaining a related sampling interval to said given value for said spectrum without aliasing to said base band.

14. An apparatus according to claim 13, wherein said given value is a least value of said sampling frequencies.

* * * * *